United States Patent [19]

Moraveji

[11] Patent Number: 5,512,859
[45] Date of Patent: Apr. 30, 1996

[54] AMPLIFIER STAGE HAVING COMPENSATION FOR NPN, PNP BETA MISMATCH AND IMPROVED SLEW RATE

[75] Inventor: Farhood Moraveji, San Jose, Calif.

[73] Assignee: National Semiconductor Corporation, Santa Clara, Calif.

[21] Appl. No.: 340,556

[22] Filed: Nov. 16, 1994

[51] Int. Cl.$^6$ ............................................ H03F 3/30
[52] U.S. Cl. ..................... 3303/267; 330/255; 330/257; 330/261; 330/263
[58] Field of Search .................................. 330/255, 257, 330/261, 263, 267

[56] References Cited

U.S. PATENT DOCUMENTS

| | | | |
|---|---|---|---|
| 3,815,037 | 6/1974 | Wheatley, Jr. | 330/257 |
| 4,791,383 | 12/1988 | Monticelli et al. | 330/265 |
| 4,827,223 | 5/1989 | Gross | 330/267 |
| 4,833,424 | 5/1989 | Wright | 330/267 |
| 4,894,622 | 1/1990 | Buitendijk | 330/307 |
| 4,970,470 | 11/1990 | Gosser | 330/255 |
| 5,049,653 | 9/1991 | Smith et al. | 330/267 |
| 5,150,074 | 9/1992 | Gosser | 330/263 |
| 5,218,321 | 6/1993 | Jost | 330/267 X |
| 5,323,122 | 6/1994 | Bowers | 330/267 X |
| 5,339,042 | 8/1994 | Kaire et al. | 330/261 X |

FOREIGN PATENT DOCUMENTS

| | | | |
|---|---|---|---|
| 1160530A | 6/1985 | U.S.S.R. | 330/255 |
| 1192111A | 11/1985 | U.S.S.R. | 330/263 |
| 1254579A | 8/1986 | U.S.S.R. | 330/267 |

OTHER PUBLICATIONS

U.S. Pending Patent Application Serial No. 08/341,818, filed Nov. 18, 1994, Title: Fast Slewing Amplifier Using Dynamic Current Mirrorw, Attorney Dock No. NS-2599 US.

U.S. Pending Patent Application Serial No.: 08/362,030, filed Dec. 22, 1994, Title: Triple Buffered Amplifier Output Stage, Attorney Docket No. NS-2607 US.

*Primary Examiner*—James B. Mullins
*Attorney, Agent, or Firm*—Skjerven, Morrill, MacPherson, Franklin & Friel; Norman R. Klivans

[57] ABSTRACT

A fully symmetrical class AB amplifier includes two controllable current sources in the input stage to compensate for NPN, PNP transistor beta mismatch. This beta mismatch creates an offset current that is reflected back to the input stage and creates a systematic voltage offset. One controllable current source is provided for each of the top side and the bottom side of the input stage, and each current source, sources/sinks a current of a predetermined value to make up the current offset caused by the beta mismatch. In a second embodiment, slew-enhancement transistors are included in an amplifier input stage, one transistor associated with each of the top side and bottom side portions of the stage to provide a current boost during high slew events (transients) at the amplifier non-inverting input. These slew enhancement transistors are normally off; during a fast rising or falling input signal pulse, one of these transistors provides extra base current to the base of the top side or bottom side output transistor of the stage. Additionally, the collector current of each slew enhancement transistor is mirrored back to a high impedance point in an output stage of the amplifier to charge and discharge the compensation and parasitic capacitance during large input signal slews, to further improve amplifier performance.

18 Claims, 7 Drawing Sheets

AMPLIFIER STAGE HAVING COMPENSATION FOR NPN, PNP BETA MISMATCH AND IMPROVED SLEW RATE

BACKGROUND OF THE INVENTION

1. Field of the Invention

This invention relates to amplifiers and more specifically to the input stage of a Class AB amplifier.

2. Description of Related Art

1. NPN, PNP Beta Mismatch

Amplifiers of the type suitable e.g. for operational amplifiers are well known in the art. Such amplifiers typically have an input stage of the Class AB type which as is well known includes at least two transistors in each buffer, one of which is a "push" (top side) transistor, the second of which is a "pull" (bottom side) transistor. Typically, one of these is a (bipolar) NPN transistor and the other is a (bipolar) PNP transistor. As is also well known, due to the intrinsic differences between P and N type semiconductor materials, the PNP transistor will have a higher beta (gain) than the NPN transistor. This asymmetry in transistor beta disadvantageously results in the output voltage not being exactly at ground level, when the bias conditions require it to be at ground.

Any output voltage present when the amplifier's output signal should be zero is conventionally termed the systematic offset voltage. This is the voltage difference that must be applied to the amplifier input (inverting and non-inverting) terminals to shift the output signal offset to zero. Typically this compensation is accomplished by providing adjustable resistances (trim resistors) to compensate for the gain differences in the two transistors. This trimming process is also called voltage offset nulling. The need to provide trimming for each individual amplifier is an additional expense in terms of amplifier fabrication. Also, the trim resistors consume (in an integrated circuit) chip "real estate".

FIG. 1 shows an amplifier having the above-described systematic voltage offset and shows the relevant current flows (each indicated by the letter I). The reference "$I_{BP}$" is to the base current of a PNP transistor; the reference "$I_{BN}$" is to the base current of an NPN transistor. Supply voltage Vee is equal to voltage $-V_{cc}$ in this disclosure.

The inverting input buffer includes transistors Q1 and Q2 and the non-inverting input buffer includes transistors Q3 and Q4. Both the topside transistors Q1, Q3 in the input buffers and the bottom side transistors Q2, Q4 in the input buffers are connected to constant current sources respectively $I_1$ and $I_2$, which each source/sink a current of 2I, where I is equal to the current in the output stage flowing between the nodes at the bases of transistors Q10 and Q11. (It is to be understood that the amplifier input stage is generally to the left hand side of the drawing and the amplifier output stage to the right hand stage of the drawing.)

As can be seen, the difference between $I_t$ (the top side current through the non-inverting input buffer) and $I_b$ (the bottom side through the inverting buffer) is $I_b - I_t = I_{OS}$ which is the offset current. As can be seen by the circuit analysis, then $I_{OS} = (I - 2I_{BN}) - (I - 2I_{BP}) = 2(I_{BP} - I_{BN})$.

Conventionally $I_{BN}$ is approximately equal to $I/\beta_N$ and $I_{BP}$ is approximately equal to $I/\beta_P$. Thus $I_{OS} = 2I(1/\beta_P - 1/\beta_N)$. It is to be understood that $\beta$ refers to the "beta", i.e. current gain factor, of a particular transistor. Thus if $\beta_P = 50$ and $\beta_N = 100$ and I=1 mA, then $I_{OS} = 20$ µA. Thus the offset current $I_{OS}$ is 20 µA. As can be seen then the systematic offset voltage $V_{OS} = R_E \times (I_{BN} - 2I_{BP})$.

This offset current $I_{OS}$ will be reflected back to the input stage, and multiplied by the input stage gain factor $g_m$ thus creating a systematic voltage offset $V_{OS} = I_{OS} \times 1/g_m$. For example if $1/g_m = 500$ ohms, then the systematic voltage offset $V_{OS} = 20$ µA × 500 ohms = 2.5 mV.

Another amplifier, having some similarities to that of FIG. 1 but being somewhat more complex, is shown in FIG. 2 with the accompanying current flow analysis. In this case, the input stage voltage offset is between node A and node B. Node A is associated with the non-inverting input buffer including transistors Q5–Q8 while node B is associated with the inverting input buffer including transistors Q1–Q4.

Here the difference $I_{OS}$ between the top side current $I_t$ and the bottom side current $I_b$ for the non-inverting input buffer is equal to $I_b - I_t = I_{OS}$. Thus $I_{OS} = (I - 2I_{BN}) - (I - 2I_{BP}) = 2(I_{BP} - I_{BN})$. Since again $I_{BN}$ is approximately equal to $I/\beta_N$ and $I_{BP}$ is approximately equal to $I/\beta_P$, then $I_{OS} = 2I(1/\beta_P - 1/\beta_N)$. Thus again if $\beta_P = 50$ and $\beta_N = 100$ and I=1 mA, then $I_{OS} = 20$ mA. Thus this offset current $I_{OS} \times R_E = V_{OS}$ which is the systematic offset voltage.

In the amplifier of FIG. 2, the beta (gain) mismatch is in the amplifier output stage and is between the NPN transistors and the PNP transistors used in the top and bottom side modified Wilson current mirrors (respectively transistors $Q_{11}$, $Q_{12}$, $Q_{14}$ and $Q_{24}$, $Q_{25}$, $Q_{26}$) in the amplifier output stage. For example, as described above, NPN type transistor Q16 has a beta (gain) factor of 50, and PNP type transistor Q21 has the higher beta (gain) factor of 100. Thus the base current $I_{BP}$ of transistor Q16 is, given a current I of 1 mA (1000 µA), equal to 20 µA, and the base current $I_{BN}$ of transistor Q21 is 10 µA. Thus the current $I_t$ at the collector of transistor Q5 is 960 µA (1,000 µA−40 µA) and the current $I_b$ at the collector of transistor Q6 is 980 µA (1,000 µA−20 µA). Thus this current offset causes the above-described systematic voltage offset problem which may be overcome by adding trimmable resistors (not shown) at appropriate locations such as in current mirrors Q11 to Q13 and Q23 to Q25, or by some other type of trimming operation.

It would be desirable to provide an amplifier that does not require trimming to overcome the systematic offset voltage caused by NPN, PNP beta mismatch, and which does not also require trim resistors at all, due to the accompanying undesirable extra manufacturing expense of trimming and the chip real estate consumed by the trim resistors.

2. Slew Rate Performance

A second and separate technical problem from that of the above-described NPN, PNP beta mismatch is that in a conventional voltage-feedback amplifier input stage, there is a direct relationship between the supply current and the slew rate. In a typical single stage folded cascode amplifier, the widest bandwidth is achievable while the slew rate is limited to the amount of supply (tail) current available to charge the total capacitance of the high impedance node. Since the slew rate is the supply current divided by the total capacitance, in order to obtain higher slew rates, either the supply current must be increased or the total capacitance decreased. In integrated circuit amplifiers, any reduction in the total capacitance is limited by the total of the parasitic junction capacitances set by the integrated circuit fabrication process and the size of the transistors included in the integrated circuit. To increase the slew rate without disturbing the bandwidth, input stage transconductance must be reduced by increasing the resistance of the input stage. This however undesirably results in higher input noise, more input offset voltage, and less open loop gain.

It is also known to use a current-feedback amplifier which typically provides excellent slew rate performance. Thus the closed loop bandwidth is independent of the noise gain, and depends on the feedback resistor. However, as is well known these types of amplifiers suffer from higher noise, higher input offset current, less precision and poor low level settling as well as other problems. See D. L. Smith, "High Speed Operational Amplifier Architectures",
Proceedings of the 1993 BCTM.

FIG. 3 shows a schematic diagram of a prior art current-feedback amplifier. (Reference symbols used in FIG. 3 that are identical to those in FIG. 1 or 2 do not refer to identical structures.) Here the input stage is a unity-gain buffer forcing the inverting input (−in) to follow the non-inverting input (+in). Any voltage imbalance of the inputs of this buffer causes the current to flow in or out of the inverting input. These currents are sensed internally to charge and discharge the internal compensation capacitors CT1 and CT2. The amount of current depends on the feedback resistor Rf2 which couples the output ("out") of the amplifier to its inverting input. Therefore the small-signal bandwidth of the amplifier, to a first approximation, depends on the time constant of the feedback resistor Rf2 and the total compensation capacitance CT1 plus CT2, and is independent of closed loop gain. See D. F. Bowers, "The Impact of New Architectures on the Ubiquitous Operational Amplifier"
Proceedings of the 1992 Workshop on Advances in Analog Circuit and Design in Europe.

For the amplifier shown in FIG. 3, any large input step creates momentarily a large error of voltage across the feedback resistor Rf2. The current available to charge and discharge the compensation capacitors CT1, CT2 is proportional to this voltage and inversely proportional to the value of the feedback resistance. This might suggest an unlimited slew rate; however, in reality a variety of second order effects limit the slew rate. Despite the high slew capability of such an amplifier, the Early effect of transistors of Q1 to Q4 causes poor CMMRR (common mode rejection ratio).

Therefore typically in the input stage of a class AB amplifier, during a slew when the input signal is rapidly increasing or decreasing in amplitude, there is undesirably a failure of the output signal to respond rapidly to the increase or decrease in the input signal. This is due to the limited current available to, in the amplifier of FIG. 3, transistors Q1 and Q2. The current available to transistors Q1 and Q2 is limited respectively by the constant current supplies I1, I2. This limits the capability of transistors Q3 and Q4 to respond adequately to a slew in the non-inverting input signal because current sources I1, I2 must charge or discharge the capacitances at respectively the bases of transistors Q3, Q4. These capacitances include the parasitic capacitances present between (1) the emitter of transistor Q2 and the collector of transistor Q3 (capacitance Cjc3) and (2) the emitter of transistor Q1 and the collector of transistor Q4 (capacitance Cjc4). This inability to respond rapidly is largely due to the parasitic capacitances present in transistors Q3, Q4 and the internal capacitances of current sources I1, I2 themselves. Thus there is a need for improvements in the slew rate performance of the input stage of an amplifier, given the minimum amount of total capacitance present in a typical amplifier, and without substantially increasing power consumption to provide higher supply current.

FIG. 4 shows schematically the input stage of a voltage feedback amplifier having the same deficiency as the amplifier of FIG. 3 in that the current available to output transistors Q5 and Q6, and hence their ability to respond to a high slew rate signal, is limited by the amount of current provided by constant current sources I3, I6 connected to the bases of transistors Q5, Q6 respectively. Note that the left hand portion of FIG. 4 shows the input stage of an amplifier; the output stage is depicted merely as the "Buffer".

It is to be understood that the NPN, PNP beta mismatch is a separate problem from that of slew rate performance.

SUMMARY OF THE INVENTION

1. NPN, PNP Beta Mismatch

In accordance with a first embodiment of the invention directed to the problem of NPN, PNP beta mismatch, a class AB amplifier is modified by the addition to the amplifier input stage of two controllable current sources which together eliminate voltage offset and hence solve the NPN, PNP beta mismatch problem. One controllable current source is associated with each side (push and pull, e.g. top and bottom) of the amplifier exhibiting the NPN, PNP mismatch. The controllable current sources each source/sink a current which is set at a particular level to compensate for the output stage NPN, PNP transistor beta (gain) mismatch and thus eliminate the systematic input voltage offset, i.e. eliminate or minimize the need for trimming or offset voltage provision.

Each controllable current source includes a constant current source connected by a control transistor to a respective circuit node respectively in the top side and bottom side of the input stage. The emitter (a first current handling terminal) of each control transistor is connected to its associated constant current source, and its base is connected to the respective circuit node. The collector (a second current handling terminal) of each control transistor is connected to a reference voltage, respectively Vcc and Vee (equal to $-V_{cc}$). Each constant current source provides a predetermined amount of current to eliminate (or minimize) the systematic voltage offset. That is, for each of the two controllable current sources, the level of current provided (sourced/sunk) is such that when combined with the level of current at the associated circuit node, the total current at the two circuit nodes is equal for the top side and bottom side portions of the amplifier input stage.

The actual amount of current provided by each current source is thus determined by application of Kirchoff's rules to the associated circuit node. Thus this "makeup" current from the controllable current sources compensates for the effects of the beta mismatch between the NPN and PNP transistors in e.g. the output (or input) stage of the amplifier.

To put this another way, a control transistor is added to each of the top and bottom side of the non-inverting input buffer of the input stage, and the current through the emitters of each of the two control transistors is set to be, e.g., twice the current through the amplifier output stage. Thus the current offset between the inverting and non-inverting input buffers is zero, and hence the systematic offset voltage is also zero.

This first embodiment of the present invention is thus not limited to overcoming the problem of beta mismatch in amplifier input stages, but is generally applicable to AB Class amplifiers or any other type of amplifiers using bipolar transistors. For instance, as described below, controllable current sources in an amplifier input stage may compensate for NPN, PNP beta mismatch in the amplifier output stage as in FIG. 2. Also while a typical application is to an operational amplifier, the invention is not limited to such applications. The invention is also not limited to integrated circuit amplifiers, but is also applicable to amplifiers made of discrete components.

Advantageously, use of beta compensation in accordance with the invention eliminates systematic offset voltage and hence eliminates the need for trim resistors or other trimming of the amplifier input stage. Additionally, in an IC amplifier it has been found that the invention tracks well over semiconductor fabrication process variations. That is, systematic offset voltage is eliminated in spite of process variations.

2. Slew Rate performance

In accordance with a second embodiment of the invention directed to the slew rate performance problem, a voltage feedback amplifier has a class AB input stage which is provided with a slewing characteristic similar to that of a current feedback amplifier. The quiescent current of the input stage is set by cascoded current mirrors for both the top side and bottom side of the input stage. Slew-enhancement transistors are provided, one such transistor for each of the topside and bottom side of the input stage. The two slew-enhancement (current boost) transistors are normally off. However, if the non-inverting input is driven by a fast positive-going pulse or a fast negative-going pulse (a slew), these two transistors provide extra current to the base of the associated output transistor in the input stage during respectively the positive slew and the negative slew. The collector currents of each the two current boost transistors are mirrored back to a high impedance point of the amplifier (i.e., an input terminal to the amplifier's output stage) to charge and discharge the compensation capacitor(s) connected to the high impedance node faster during large non-inverting signal slews. In order to accomplish this, the collector of the top side current boost transistor is connected to the collector of the corresponding top side output transistor of the input stage, and the collector of the bottom side current boost transistor is connected to the collector of the corresponding bottom side output transistor of the input stage.

While the present disclosure is directed to bipolar transistor amplifiers, the present invention as directed to the slew rate performance improvement is also applicable to FET (e.g. CMOS) amplifiers. The second embodiment (slew rate performance) is not limited to amplifier input stages, but is also applicable to other amplifier stages that must respond to a fast slewing input signal.

BRIEF DESCRIPTION OF THE DRAWINGS

Identical reference symbols used variously in the Figures do not refer to identical structures unless so indicated.

DETAILED DESCRIPTION OF THE INVENTION

1. NPN, PNP Beta Mismatch

Figure 5:
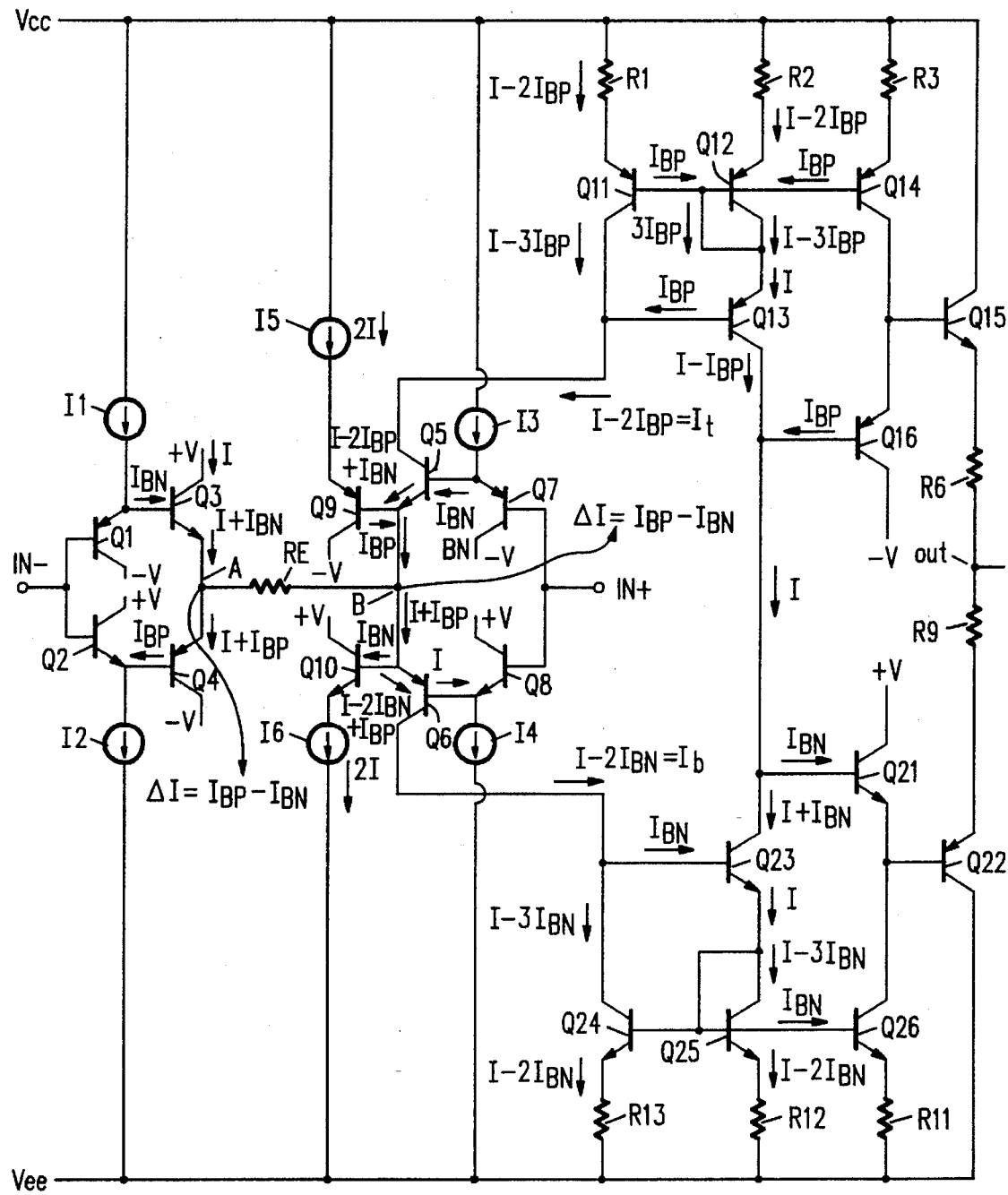
FIG. 5 shows a schematic of an amplifier in accordance with a first embodiment of the present invention.

FIG. 5 shows a schematic of a low power, high speed voltage feedback amplifier in accordance with a first embodiment of the present invention directed to the NPN, PNP beta mismatch problem. This amplifier is identical to that of FIG. 2 with like reference numbers indicating identical structures, except that FIG. 5 also includes first constant current source $I_5$ connected between the positive supply voltage ($V_{cc}$) and the emitter terminal of first control transistor Q9, and second constant current source $I_6$ connected between the negative supply voltage ($V_{ee}$) and the emitter terminal of second control transistor Q10. Transistors Q9 and Q10 respectively control the application of current from current sources $I_5$ and $I_6$, via their respective base terminals, to the emitter terminals of respectively transistors Q5 and Q6.

Figure 1:
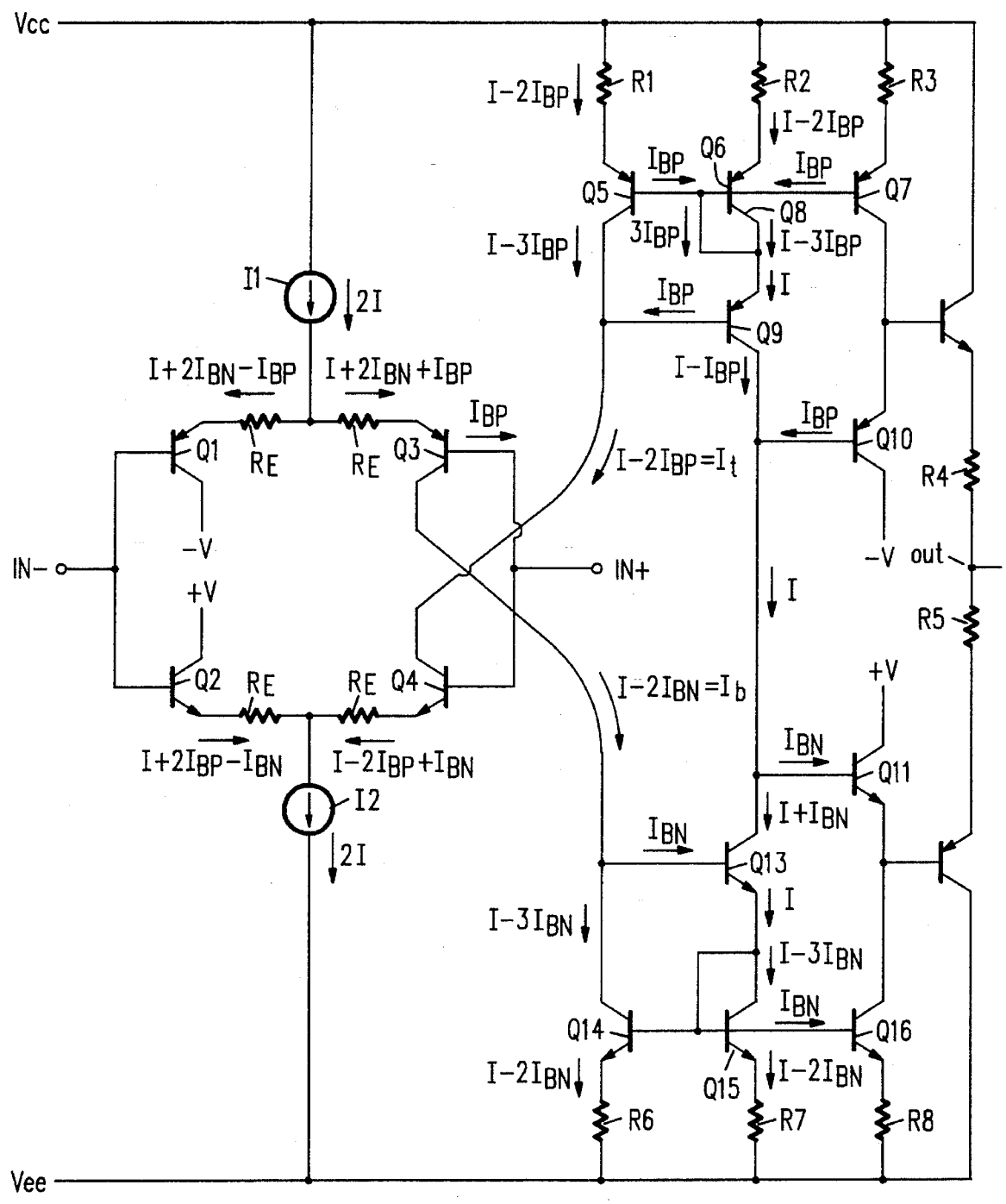
FIG. 1 shows a first amplifier illustrating the problem of NPN, PNP beta mismatch.
Figure 2:
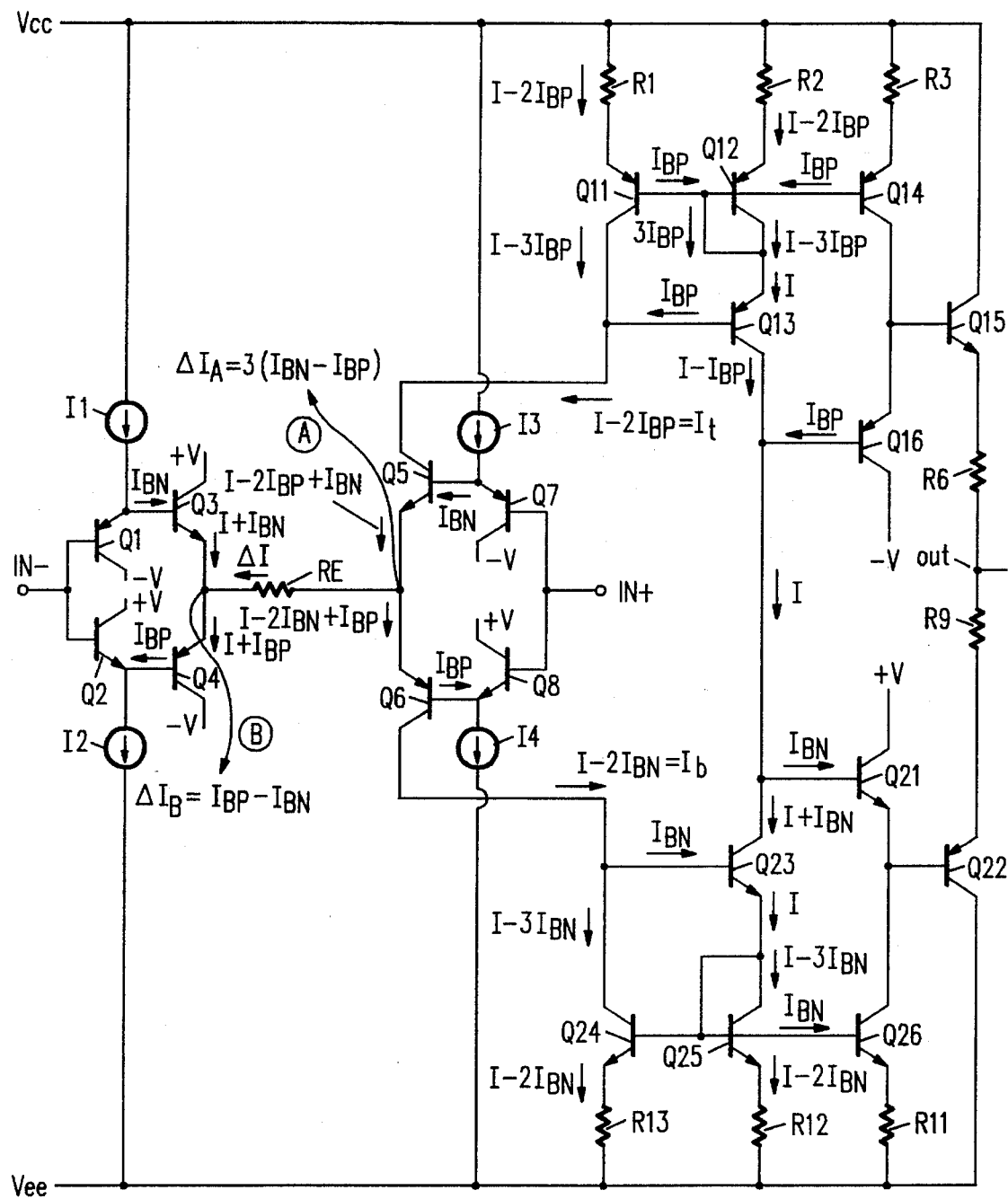
FIG. 2 shows a second amplifier illustrating the problem of NPN, PNP beta mismatch.

In accordance with the presence invention, the beta mismatch of the amplifiers of FIGS. 1 and 2 is thereby overcome. Current sources $I_5$ and $I_6$ each provide, in this illustration, current 2I in order to overcome the current offset at the associated output stage transistors Q16 and Q21. Thus the base of control transistor Q9 sources 40 μA of base current ($2I_{BP}$) and the base of control transistor sinks 20 μA of base current ($2I_{BN}$), making up the current offset $I_{OS}$ caused by the beta mismatch. It is to be understood that for any particular amplifier, the level of current to be provided by current sources $I_5$ and $I_6$ and transistors $Q_9$, $Q_9$ is determined by a conventional circuit analysis.

Thus it can seen with reference to FIG. 5 as compared to FIG. 2 that by adding transistors Q9 and Q10 and setting the current through their respective emitters to be 2I, the ΔI (bottom side minus top side current) at both node A and node B of FIG. 5 is the same and equal to $I_{BP}-I_{BN}$. Thus the offset current $I_{OS}$, which is equal to the difference in the current at node A and node B, is zero and hence the corresponding systematic voltage offset $V_{OS}$ is also zero and hence in accordance with the invention is eliminated (or at least minimized).

Thus the systematic voltage offset problem which otherwise is present in the amplifiers of FIGS. 1 and 2 is overcome in accordance with the present invention.

In the present example, the value 500 ohms of resistor $R_E$ is not limiting. It is also to be understood that the particular values of current sources $I_5$ and $I_6$ provided here are illustrative and are determined by the relative beta mismatch of the NPN and PNP transistors.

In one embodiment, each of constant current sources $I_1, \ldots, I_6$ is a conventional cascoded current mirror, being a series connected resistor and two transistors, the bases of the two transistors each being connected respectively to two nodes connected between $V_{cc}$ and $V_{ee}$. The value of the resistor and the size of the transistors in each current source conventionally determines the amount of current provided. Thus in one embodiment each of current sources $I_1, \ldots, I_6$ is a cascoded current mirror including two identical series connected transistors connected by a resistor to $V_{cc}$ (for $I_1$, $I_3$, and $I_5$) or to $V_{ee}$ (for $I_2$, $I_4$, and $I_6$). The resistor in $I_5$ and $I_6$ is one half the value of that for $I_1$, $I_2$, $I_3$, and $I_4$, to supply twice the current. The term current "mirror" is used because in one embodiment each of the transistors in the current sources is identical, being fabricated by the same process steps. Other types of current sources may also be used.

In this illustrative amplifier (but not forming a part of the present invention) the transconductance of the input stage is set by the bias current and the resistor $R_E$. A capacitor (not shown) may be connected in parallel with resistor $R_E$ to create a high frequency zero that improves the phase margin and extends the bandwidth.

The output stage shown here is for illustration as one having an NPN, PNP mismatch and also does not form part of the present invention. (The mismatch could be present in the input stage.) Other output stages are also usable in accordance with the present invention, including conventional types of output stages as are well known in the art.

2. Slew Performance Improvement

Figure 6A:
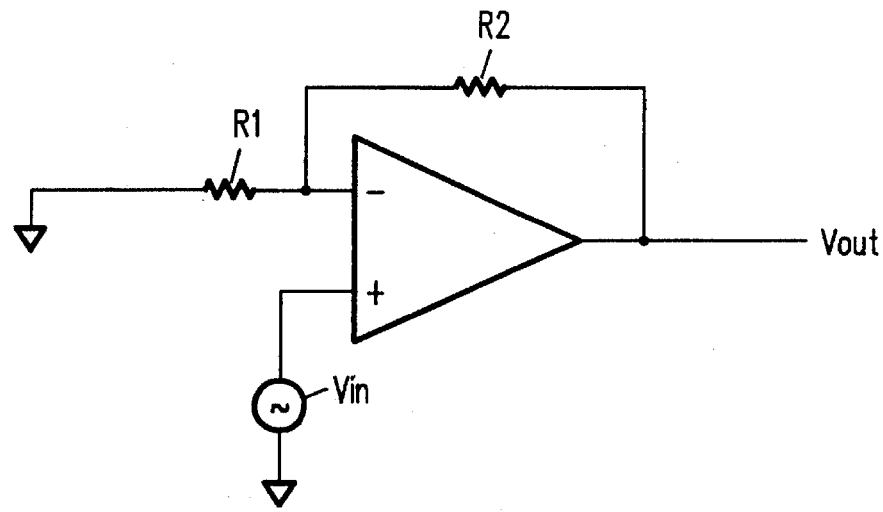
FIG. 6a shows an amplifier connected to illustrate an advantage of the second embodiment of the present invention.

FIG. 6a shows an amplifier 10 connected in accordance with the present invention with its non-inverting (+) terminal connected to a signal source $V_{in}$ and its inverting terminal (−) connected via resistor R1 to ground and via resistor R2 to its output terminal labelled $V_{out}$.

Figure 6B:
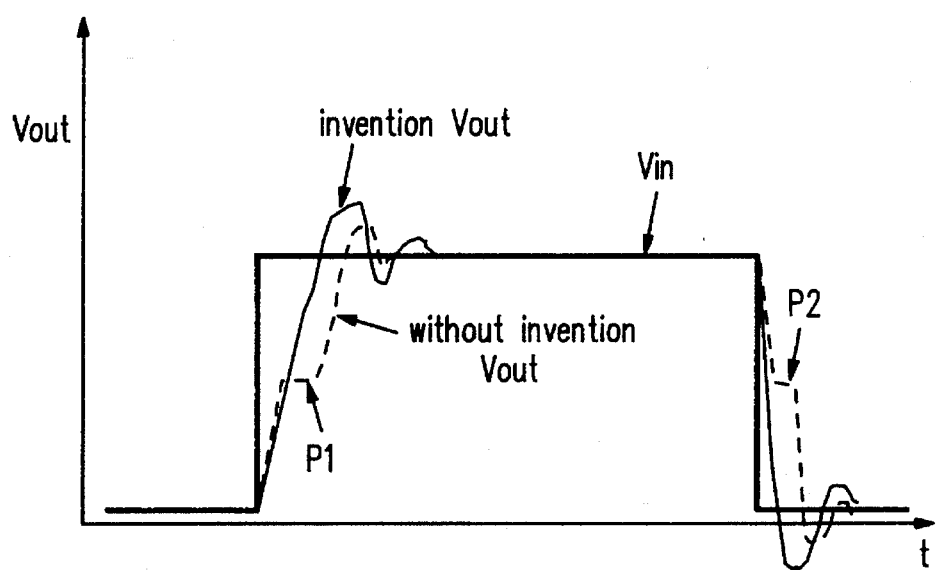
FIG. 6b shows graphically the effect of slew rate enhancement in accordance with the second embodiment of the present invention.

An advantage of the present invention is illustrated in FIG. 6b. Here, the graph of amplifier output voltage $V_{out}$ (vertical axis) versus time t (horizontal axis) shows that without the invention, e.g., for the amplifier of FIG. 4, during a high slew rate input signal that the amplifier output voltage as shown by the broken line plateaus at a certain point P1 for an upward going signal and at point P2 for a downward going signal. (The input signal $V_{in}$ is illustrated for clarity.) This plateauing is because the output transistors in the input stage in effect "run out of steam" due to the need to charge the associated parasitic capacitances. Thus an undesirable delayed response is seen to be a fast rising (or falling) input signal $V_{in}$ in terms of the output signal voltage $V_{out}$.

In accordance with the invention as also shown in FIG. 6b, the plateaus (or kinks) in the output signal voltage at P1, P2 are eliminated by providing a momentary current boost at the critical instant by current boost transistors.

Figure 4:
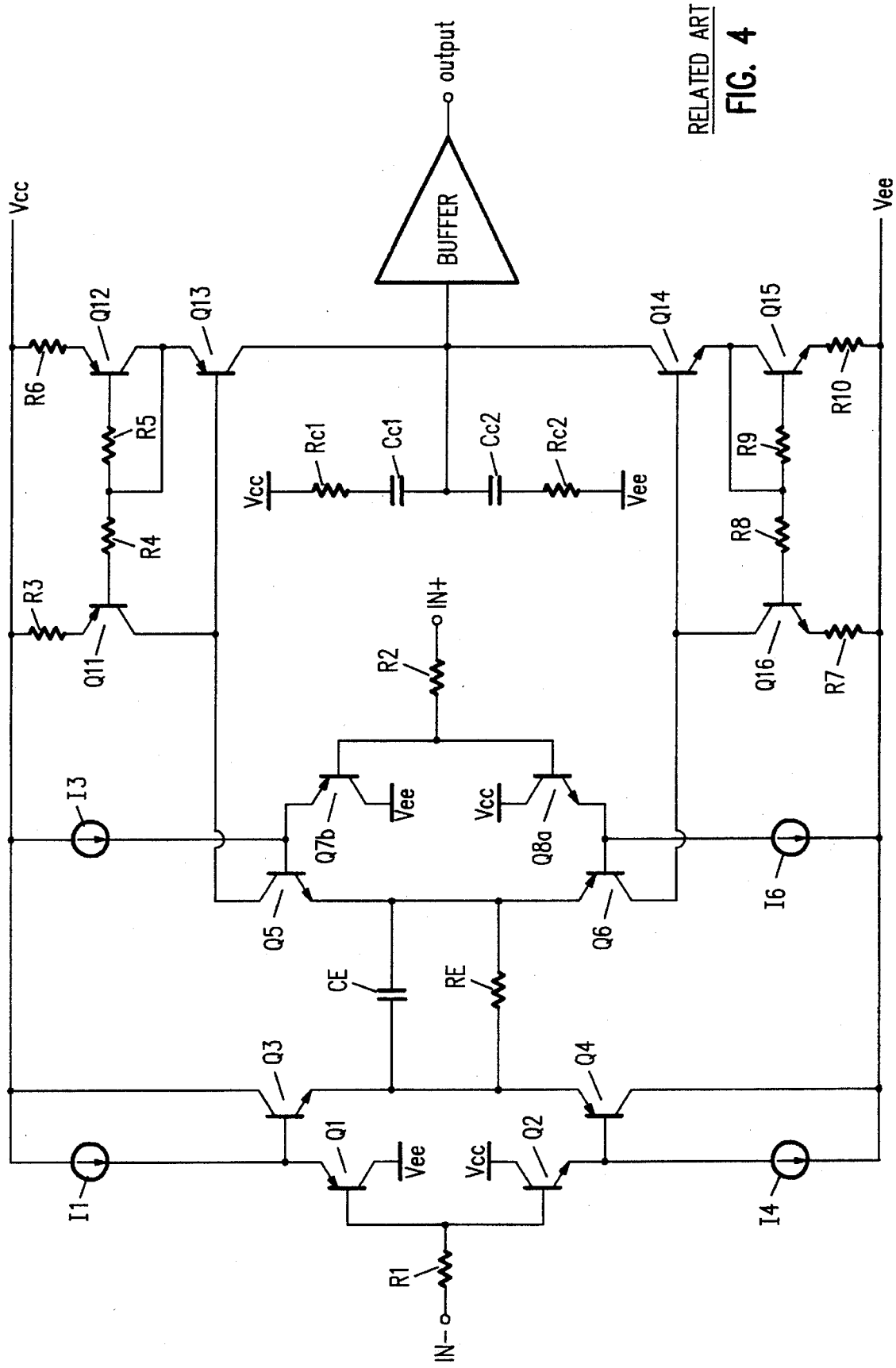
FIG. 4 shows a voltage feedback amplifier illustrating the slew rate problem.
Figure 7:
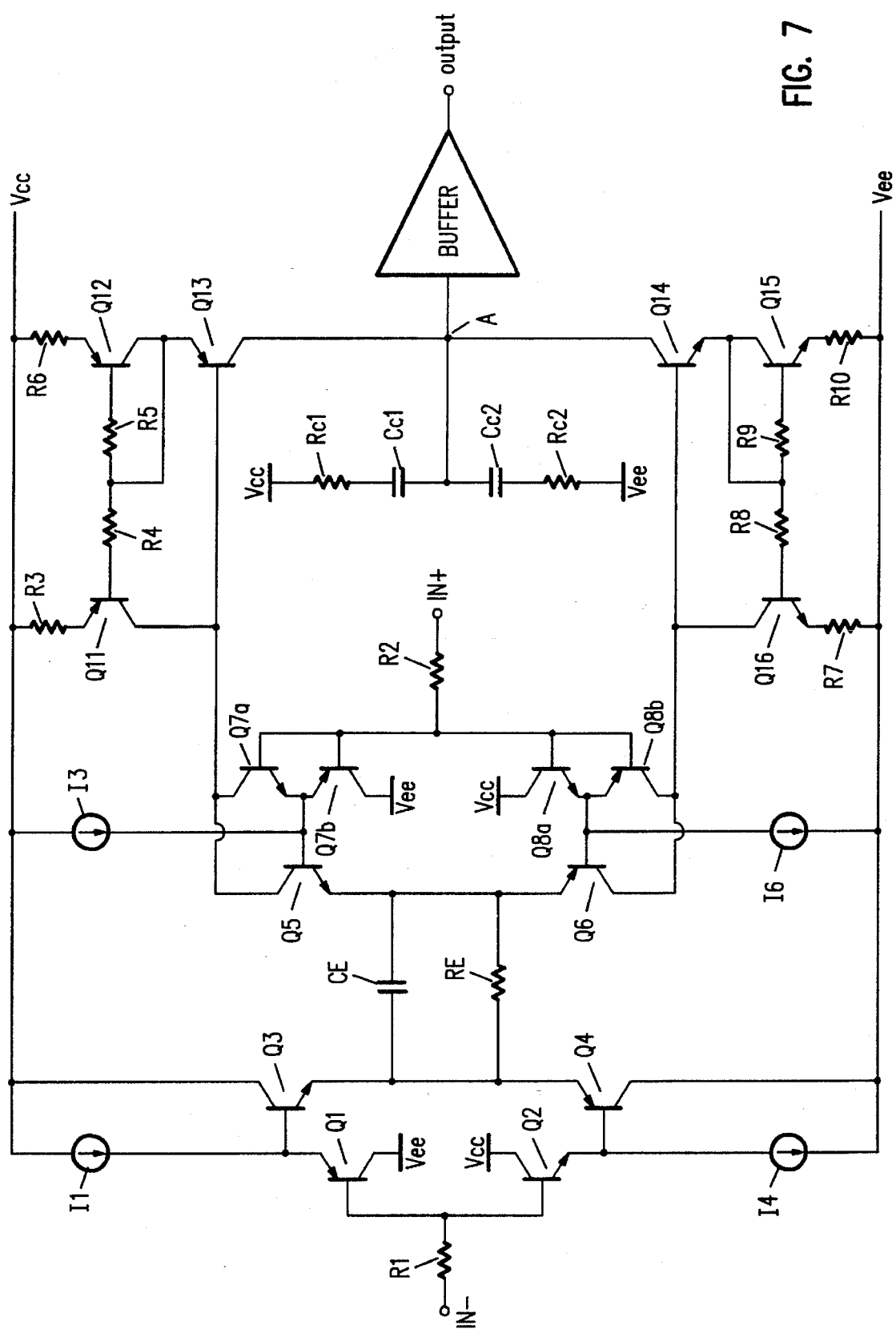
FIG. 7 shows a schematic of an amplifier input stage in accordance with the second embodiment of the present invention.

FIG. 7 shows a schematic of an amplifier in accordance with the present invention similar to that of FIG. 4, with the addition of current boost transistors Q7a and Q8b. In the amplifier of FIG. 7, the input stage is a class AB input stage and fully symmetrical. The transconductance of the input stage is set by the bias current and the resistor $R_E$. The quiescent current of the input stage is set by the cascoded current mirrors (of the type described above) I1, I3 for the top side of the input stage and I4, I6 for the bottom side of the input stage. This class AB input stage has a similar slewing characteristic to that of a current feedback amplifier, even though this is a voltage feedback amplifier. Transistors Q5, Q6, Q7b, Q8a buffer the non-inverting input (in+). Resistor $R_E$ is hence the equivalent of a feedback resistor. Transistors Q1 to Q4 buffer the inverting input. The transconductance of the input stage is set by the bias current and the feedback resistor $R_E$. The capacitor CE connected in parallel with resistor $R_E$ creates a high frequency zero that improves the phase margin and extends the bandwidth.

In this second embodiment, important elements are the slew enhancement (current boost) transistors Q7a and Q8b which are normally off. However, if a fast pulse (a high slew rate pulse in terms of amplitude and rise time) is present at the non-inverting input terminal in+, transistors Q7a and Q8b provide extra current to respectively the bases of transistors Q5 and Q6. Transistors Q7b and Q8a are respectively referred to herein as the input transistors of the input stage and transistors Q5 and Q6 are respectively the output transistors of the input stage.

In addition, the collector currents of transistors Q7a and Q8b are mirrored back by respectively two current mirrors including (1) transistors Q11 to Q13 and (2) transistors Q14 to Q16 to the amplifier high impedance point node A to charge and discharge the compensation capacitors Cc1, Cc2 faster during a large signal slew.

In accordance with the invention the current boost provided by transistors Q7a and Q8b need not be provided in a circuit exactly like that of FIG. 7. That is, the invention more broadly encompasses provision of a temporary boost current to an input stage of an amplifier in response to a fast slewing input signal.

Figure 3:
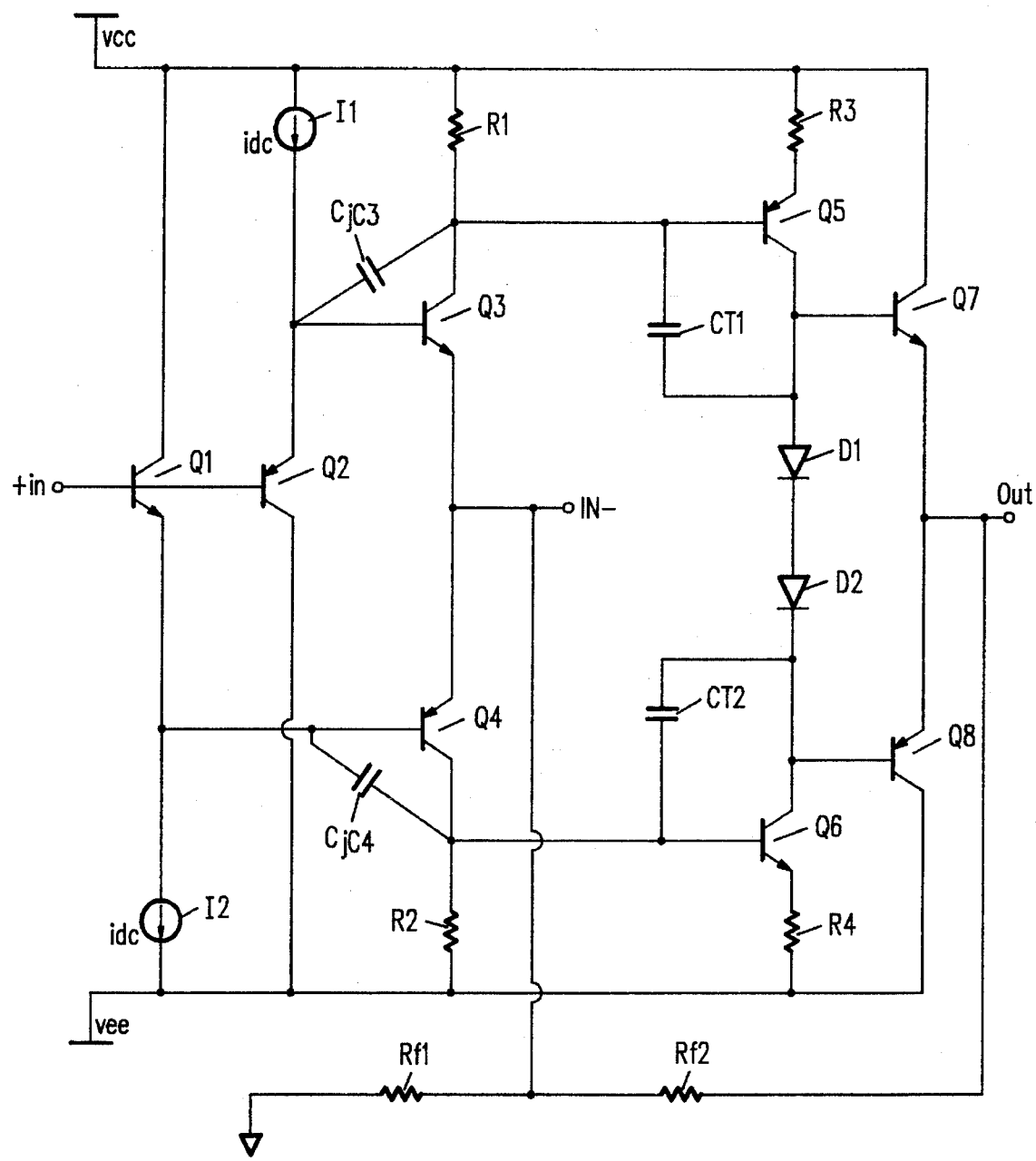
FIG. 3 shows a current feedback amplifier illustrating the slew rate problem.

Thus the response of transistors Q5 and Q6 is enhanced to a fast slewing input signal. In order to do this, the current output of these transistors is increased quickly in response to such a signal. This fast response is inhibited in amplifiers such as those of FIGS. 3 and 4 by the parasitic capacitances of these input transistors, and also by the capacitances of the connected current sources and other circuit components. Thus it has been found that the speed of response of the input stage is dependent on the current provided by the output transistors of the input stage and by the associated parasitic and other capacitances. Since the base of, for instance transistor Q5, is connected to the non-inverting input terminal in+ via input transistor Q7b, the voltage of the base of transistor Q5 during a slew changes at a rate of dV/dt, equal to the current through transistor Q5 divided by the total connected capacitances.

Thus in order to increase the voltage response at the collector of output transistor Q5, given a particular total capacitance of the circuit, it has been found by the present inventor that it is useful to provide extra current during the signal slew. The addition of current boost transistors Q7a and Q8b, which are associated respectively with output transistors Q5 and Q6 of the input stage, accomplishes this.

During a non-slew portion of a signal, transistors Q7a and Q8b are off. During a positive going transient (a high slew rate input signal) at the non-inverting input terminal in+, transient transistor Q7a provides a boost current to the base of transistor Q5, thus charging the capacitance at that node and improving the response of transistor Q5. In addition, since the collector of transistor Q7a is connected to the output stage including the compensation capacitors Cc1, Cc2 via the current mirror Q11 to Q13, transistor Q7a helps charge the parasitic capacitances and the compensation capacitors Cc1, Cc2, thus further improving the amplifier performance during the slew.

Transistor Q8b performs a similar function as does Q7a, but transistor Q8b is associated with the bottom side output transistor Q6 and thus provides a current boost during a negative going transient. Transistors Q7a, Q8b thus turn on during respectively a positive or negative going transient and turn off when the high impedance node A is fully charged. That is, transistors Q7a, Q8b turn off when the voltage is increased to the level where the input terminals −in, in+ are at the same potential.

As can be seen, transistors Q7b and Q8b add no quiescent current to operation of the amplifier, because transistors Q7a, Q8b are off except during high slew rate events. Thus the invention is applicable to many types of amplifiers and is not limited to a class AB input stage. Also the absence of any quiescent current means that the added transistors Q7a and Q8b advantageously consume no power except during high slew rate events.

It is to be understood that in another embodiment the provision of current boost elements such as transistors Q7b and Q8b can also be accomplished without connecting the collectors of these transistors to current mirrors. Instead in accordance with the invention the collectors of transistors Q7a and Q8b are connected e.g. to respectively the positive voltage supply $V_{cc}$ and negative voltage supply $V_{ee}$, thus making transistors Q7a and Q8b current sources for driving the bases of respectively transistors Q5 and Q6. Therefore at least part of the improvement in accordance with the invention is achieved without the use of the current mirrors, but by boosting only the current supply to the bases of transistors Q5 and Q6 during a signal slew.

Beta compensation transistors Q9 and Q10 and their associated current sources in the input stage of the first embodiment of FIG. 5 may also be used in conjunction with the second embodiment, to provide compensation for NPN, PNP beta mismatch and reduce offset voltage as described above, but are not a necessary part of the second embodiment.

In accordance with one embodiment of the invention, the various resistors and capacitors of FIG. 7 have the following values: resistors $R_E$ 500 ohms, R3 100 ohms, R4 50 ohms, R5 50 ohms, R6 100 ohms, R7 100 ohms, R8 50 ohms, R9 50 ohms and R10 100 ohms. Capacitor CE has a value 1.8 pF and each of capacitors Cc1 and Cc2 are 500 fF. Resistors R1 and R2 and Rc1 and Rc2 have values suitable for the particular application, as would be understood by one skilled in the art. It is to be understood that the voltage supply $V_{ee}$ is a negative supply voltage in the typical case.

The output stage "Buffer" illustrated in FIG. 7 may be any suitable output stage for instance of a conventional type. Other output stages are also suitable in accordance with the present invention.

This disclosure is descriptive and not limiting; further modifications to the above-described embodiments will be apparent to one of ordinary skill in the art and are intended to fall within the scope of the appended claims.

I claim:

1. An amplifier stage compensated for systematic voltage offset, the stage having first and second transistors and comprising:

a first controllable current source providing a variable current level connected to a first current handling terminal of the first transistor; and a second controllable current source providing a variable current level connected to a first current handling terminal of the second transistor;

wherein a second current handling terminal of the first transistor is connected to a first circuit node of the amplifier, and a second current handling terminal of the second transistor is connected to a second circuit node of the amplifier, there being a beta mismatch between the first and second circuit nodes;

and wherein the first and second controllable current sources provide respectfully first and second current levels, the first current level plus the current at the first circuit node being approximately equal to the second current level plus the current at the second circuit node.

2. The stage of claim 1, wherein the first controllable current source includes a constant current source connected to a first current handling terminal of a control transistor, a control terminal of the control transistor being connected to the first current handling terminal of the first transistor.

3. The stage of claim 2, wherein a second current handling terminal of the control transistor is connected directly to a reference voltage.

4. The stage of claim 1, wherein the first current level is equal to twice a current level at a control terminal of the second transistor.

5. The stage of claim 1, wherein the first and second current levels are set to minimize a voltage offset between the first and second circuit nodes.

6. A method of compensating an amplifier for a systematic voltage offset, the amplifier having a stage having first and second output transistors, comprising the steps of:

sourcing a first variable current to a first current handling terminal of the first output transistor; and sinking a second variable current from a first current handling terminal of the second output transistor;

wherein the first current and second current are each variable to minimize the systematic voltage offset of the amplifier; and controlling the first current in response to a voltage at a current handling terminal of the first transistor.

7. An amplifier stage having improved slew rate performance, comprising:

a signal input terminal;

an input transistor having its control terminal connected to the signal input terminal and having first and second current handling terminals;

an output transistor having its control terminal connected to the second current handling terminal of the input transistor and having first and second current handling terminals; and a current boost transistor having its control terminal connected to the signal input terminal and having first and second current handling terminals, the first current handling terminal being connected to the control terminal of the output transistor, and the second current handling terminal being connected to a constant current source.

8. The amplifier stage of claim 7, wherein the constant current source mirrors a current in the amplifier stage.

9. The amplifier stage of claim 7, wherein the input transistor and current boost transistor are of different polarity types.

10. The amplifier stage of claim 7, wherein the second current handling terminal of the current boost transistor is also connected to the second current handling terminal of the output transistor.

11. The amplifier stage of claim 7, further comprising:

a second input transistor having a control terminal connected to the signal input terminal and having two current handling terminals;

a second output transistor having a control terminal connected to a first current handling terminal of the second input transistor and having two current handling terminals, a first current handling terminal being connected to the first current handling terminal of the input transistor and a second current handling terminal being connected to a second stage of the amplifier; and a second current boost transistor having a control terminal connected to the signal input terminal, a first current handling terminal connected to the control terminal of the second output transistor, and a second current handling terminal connected to a current source.

12. The amplifier stage of claim 11, wherein the second current handling terminal of the second current boost transistor is connected to the second current handling terminal of the second output transistor.

13. The amplifier stage of claim 11, wherein the second input transistor is of different polarity type than the input transistor, the second output transistor is of different polarity type than the output transistor, and the second current boost transistor is of different polarity type than the current boost transistor.

14. The amplifier stage of claim 11, wherein the first and second output transistors are respectively the push and pull elements of a class AB amplifier stage.

15. The amplifier stage of claim 7, wherein the current source is connected directly to a supply voltage.

16. A method of operating an amplifier stage having an output transistor controlled by an input signal which includes fast slewing portions, comprising the steps of:

during times other than fast slewing portions of the signal, providing a particular level of current to the output transistor;

during a fast slewing portion of the signal, providing an additional current to a control terminal of the output transistor, the additional current being generated in response to the fast slewing portion of the signal; and providing a current boost at a current handling terminal of the output transistor.

17. The method of claim 16, further comprising the step of providing the additional current at a level of zero current during a quiescent portion of the input signal.

18. An amplifier stage compensated for systematic voltage offset, the stage having first and second transistors and comprising:

a first controllable current source connected to a first current handling terminal of the first transistor; and a second controllable current source connected to a first current handling terminal of the second transistor;

wherein a second current handling terminal of the first transistor is connected to a first circuit node of the amplifier, and a second current handling terminal of the second transistor is connected to a second circuit node of the amplifier stage, there being a beta mismatch between the first and second circuit nodes;

and wherein the first and second controllable current sources provide respectfully first and second current levels, the first current level plus the current at the first circuit node being approximately equal to the second current level plus the current at the second circuit node;

wherein the first controllable current source includes a constant current source connected to a first current handling terminal of a control transistor, a control terminal of the control transistor being connected to the first current handling terminal of the first transistor.

* * * * *